(12) United States Patent
Gao et al.

(10) Patent No.: US 8,088,436 B2
(45) Date of Patent: Jan. 3, 2012

(54) METHOD OF COATING GRAPHITE PARTICLES WITH METALLIC CATALYST LAYER

(75) Inventors: Weixing Gao, Huai An (CN); Bin Wang, Jiangsu (CN); Zunbin Ke, Jiangsu (CN)

(73) Assignee: Jiangsu Tianyi Micro Metal Powder Co., Ltd., Huanghuatang Industry Zone, Xuyi Country, Huai An, Jiangsu (CN)

( * ) Notice: Subject to any disclaimer, the term of this patent is extended or adjusted under 35 U.S.C. 154(b) by 437 days.

(21) Appl. No.: 11/966,986

(22) Filed: Dec. 28, 2007

(65) Prior Publication Data

US 2008/0160191 A1 Jul. 3, 2008

(30) Foreign Application Priority Data

Dec. 30, 2006 (CN) .......................... 2006 1 0156071

(51) Int. Cl.
*B05D 7/02* (2006.01)
(52) U.S. Cl. .................. 427/215; 427/217; 427/249.17; 427/250
(58) Field of Classification Search .................. 427/215, 427/217, 250, 249.17
See application file for complete search history.

(56) References Cited

U.S. PATENT DOCUMENTS 5,364,663 A * 11/1994 McCune et al. .............. 427/449
6,835,365 B1 * 12/2004 Davies et al. ................. 423/446

OTHER PUBLICATIONS

Kalashnikov, Ya.A., et al., "Catalysts for the Conversion of Graphite to Diamond". Institute of Heteroorganic Compounds, Academy of Sciences of the USSR, Moscow, Feb. 1979. No page numbers. Abstract Only.*
Bovenkerk, H.P., et al., "Preparation of Diamond". Nature, vol. 184, Oct. 10, 1959, pp. 1094-1098.*

* cited by examiner

*Primary Examiner* — Bret Chen
(74) *Attorney, Agent, or Firm* — Global IP Services; Tianhua Gu

(57) ABSTRACT

This invention relates to a preparation method and equipment of graphite and catalyst composite for a kind of synthetic diamond. Firstly, graphite particles shall be placed into the heating chamber for pre-heating; secondly, the heated graphite particle will be fed into the coating room with vibrator or agitator and steam of carbonyl metal complex is input for coating; finally, the coated graphite particles are fed into a cooling and passivation room for cooling and passivation of the discharging materials or enter a next round of heating and coating. The surface of each graphite particle is plated with metal layer which can promote the crystal nucleus growing into perfect diamond crystal.

7 Claims, 1 Drawing Sheet

METHOD OF COATING GRAPHITE PARTICLES WITH METALLIC CATALYST LAYER

CROSS REFERENCE TO THE RELATED PATENT APPLICATION

This application claims the priority of the Chinese patent application No. 200610156071.6 with a filing date of Dec. 30, 2006.

FIELD OF THE INVENTION

This invention relates to a preparation method and equipment for making composite of graphite and catalyst which is used for diamond synthesis. Particularly, it relates to coating of nickel, iron, manganese, cobalt or other accelerant elements on graphite grain surface by decomposing carbonyl metal compound, such as nickel tetracarbonyl, iron pentacarbonyl, dimanganese decacarbonyl, and dicobalt octacarbonyl. More particularly, it relates to using quantity of heat provided by heated graphite thermally decomposes metal carbonyl, such as nickel tetracarbonyl, iron pentacarbonyl, dimanganese decacarbonyl, dicobalt octacarbonyl, to form a layer of nickel, iron or manganese cladding on the surface of graphite. Compound materials of graphite with nickel, iron, manganese or/and cobalt are extruded as a compound stick for making synthetic diamond.

BACKGROUND OF THE INVENTION

Synthesizing diamond under a static high-pressure must make use of catalysis of transition metal or transition alloy to actualize transform from graphite to diamond under a high temperature and high pressure. Traditional synthesis technics is assembling sheet of $Ni_{70}Mn_{25}Co_5$ alloy accelerant and graphite by turn into a synthesizing cavity to synthesize. Diamond grows along the adjacent edge of graphite sheets with catalyst sheets. In recent years, the arisen technics of powder catalyst accelerates the promotion of conversion rate in diamond synthesizing.

In the article titled <Study on Catalyzing Efficiency of Sheet Catalyst or Powdery Catalyst used for Graphite Synthesizing Diamond> published by TANG Jingyou et al., it is disclosed that in using powder catalyst technics, the graphite powder and catalyst powder can be fully mixed. There is a bigger tangent area between the graphite power and catalyst powder. No long-distance pervasion is existed during graphite being synthesized as diamond. The transfer rate of graphite to diamond is increased greatly.

In same synthesis conditions, the yield of diamond by the powder catalyst is five times of that by the sheet catalyst.

In the article titled <New Technology and development of Chinese super hard materials> published by Fang Xiaohu, he said that "the particle size of both metal powder and graphite powder should be fine than 200 mesh, and mixing them by appropriate technics", "a lower proportion between metal and graphite powder is suitable", "In the synthesis process with powder catalyst, a metal film exist is necessary. If no metal film or the metal film is not complete, the diamond growth must be not good. The role of the metal film is for transferring carbon to the diamond nucleus and for accelerating diamond growth. In whole course, the crystal growth will stop when appearing an ill status or the crystal will grow incompletely. The powdery Catalyst easily forms a metal film. Moreover, the metal film and diamond nucleus are a kind of a monomer, which is an isolated, fine globular and omnidirectional globule. Its existence is so important that in case it has been formed and hold to the whole growth phase, the diamond is quite intact single crystal."

The above-mentioned powder catalyst technics is based on mixing metal powder with graphite powder. As the big difference in density between metal powder and graphite powder, it is easy having segregate during mixing process. In addition, metal powders distributing in graphite is non-continuous. On the whole synthesizing cavity or appearance of single graphite particle, the environment is difficult to form a seriate metal film. It affects the growth of diamond crystals.

SUMMARY OF THE INVENTION

The purpose of present invention is to provide a method and equipment using the method for preparing composite material made from graphite and catalyst used for synthetic diamond. It uses thermal held by graphite particles to decompose carbonyl metal compound the deposit metal on the surface of the graphite particles, thereby makes composite material consisting of graphite and metal catalyst. It is used to replace current mixture of metal powder and graphite powder for synthetic diamond. The metal film of a compositive stick made by the composite material consisting of graphite and metal catalyst is contacted in seriate. When synthesizing diamonds, in synthesizing cavity and on the surface of single graphite particle a seriate metal film is established in easy way, thereby, carbon is transported continuously to diamond crystal nucleus and makes the growth of diamond crystal intact.

The purpose of this invention is achieved by the following technical schemes:

According to the need of different specification of synthetic diamond, graphite particles with different size or graphite particles with different size distribution is preheated. Nickel, iron, cobalt, manganese carbonyl complexes decompose on the surface of graphite by the caloric provided by heated graphite. The surface of graphite can be equably plated monolayer or composite layer of metal catalyst, such as nickel, iron, cobalt, manganese. The method includes the following steps:

a. cleaning, pollution-free and high-purity graphite particles are placed in a heating chamber, and pre-heat them in a vacuum or nitrogen, argon atmosphere.

b. Well heated graphite particles are transported to a plating room with vibrator or blender. Open the entering switch of metal carbonyl steam, input metal carbonyl steam into the plating room, turn on vibrator or blender, and equably plate metal catalyst layer on the graphite surface by decomposing metal carbonyl complex by caloric released from the heated graphite.

c. Plated graphite particles are delivered to cooling and passivating room. They are taken out after cooling and passivating or delivered to next heating-plating cycle until the thickness of plating film is up to request. At last, they are cooled, passivated, taken out, and passivated, packed.

When pre-heating the graphite particles, the lowest heating temperature should be higher than the boiling point of metal carbonyl complex for plating. The highest temperature should be determined by the plating thickness.

The thicker of plating layer, the higher temperature is needed. On contrary, the thinner of plating layer, the lower temperature is needed. The concrete temperature is confirmed by calculating the quantity of heat needed by decomposing a unit mol volume of metal carbonyl complex.

In this invention, when pre-heating graphite, the heating temperature must be above the boiling point temperature $t_f$ of metal carbonyl complex for plating to $t_f+800°$ C., it is preferred in a temperature range from $t_f+50°$ C. to $t_f+600°$ C.

The metal carbonyl complex as plating material is at least one selected from $Fe(CO)_5$, $Co_2(CO)_8$, $Ni(CO)_4$, $Mn_2(CO)_{10}$.

The plating layer of metal catalyst contains at least one selected from Fe, Co, Ni, Mn.

In the next pre-heating and plating cycle, the metal carbonyl complex can be the same used before to increase the thickness of plating film. It also can change the metal carbonyl complex for plating another metal catalyst. The metal catalyst can be plated alternately or mixed.

An equipment of the preparation method has one or more heating chambers, one or more plating rooms, one or more vaporizing rooms of metal carbonyl complex and one cooling and passivating room. The heating chamber is connected with plating room which has a vibrator or blender inside. The plating room is connected with the vaporizing room and cooling and passivating room.

Each room is set up with enter or outer meatus for protection gas and switch for connection one another. Connection of heating chambers, plating rooms, vaporizing rooms, cooling and passivating rooms can be series-wound or shunt-wound. Thereby, a close, continuous, monolayer or multilayer and single metal catalyst layer or multi-catalyst plating layers can be actualized.

To graphite and Metallic catalysts composite prepared by the method of this invention, surface of each graphite particle is coated with a catalyst layer, which is used for making compositive stick, the metal can form a seriate metal film. When synthesizing diamonds, for the synthesizing cavity of for the surface of the single graphite particle it is very easy to form a seriate metal film, thereby the carbon can be transported to the diamond crystal nucleus continuously and make the growth of diamond crystal intact. Method of present invention is a new method from agone methods for plating metal catalyst film on the surfaces of graphite particles. The new technics is simple. It has conquered shortcomings such as bad sorption between the plating material and the surface of plated material, and asymmetric plating in traditional MOCVD method.

Figure 1:
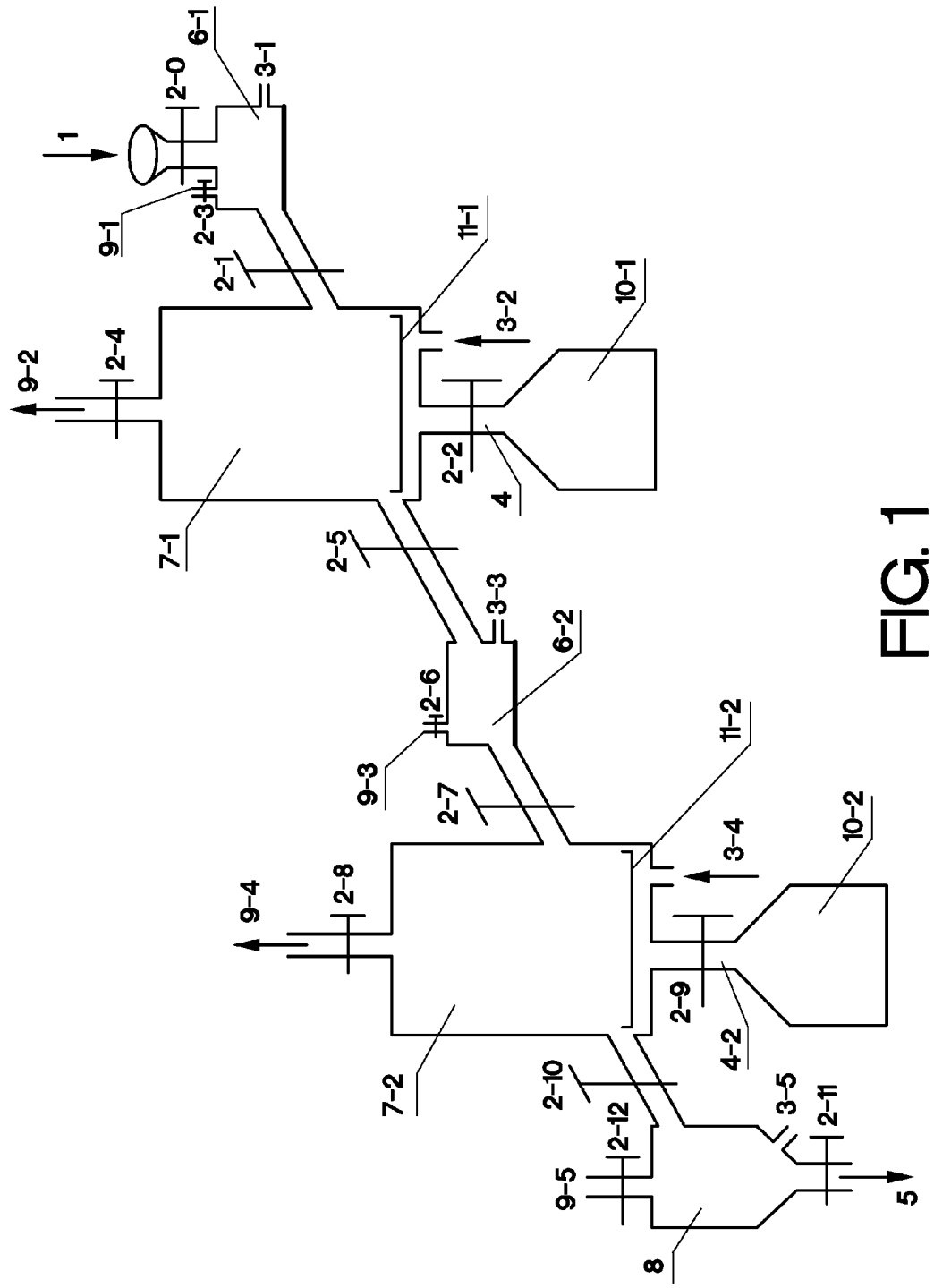
FIG. 1. is a sketch map of the technics process of the present invention.

In the Figure: 1. Adding Graphite particles into a heating chamber, 2. Switch (0~n), 3. Entering Stomata of Protection Gas (1~n), 4. Entering Stomata of Metal Carbonyl complex Steam (1~n), 5. Products Discharging Stomata, 6. Heating Chamber (1-n), 7. Plating Room (1-n), 8. Cooling and Passivating Room, 9. Protection Gas Vent or Vacuumizing Stomata I (1~n), 10. Vaporizing Room (1~n), 11. Vibrator or Blender (1~n).

DETAIL DESCRIPTION OF THE INVENTION

The method of the present invention includes following steps:

a. Clean, pollution-free and high-purity graphite particles are placed in the heating chamber 6. In order to be free from oxidation and pollution, the graphite particles must be heated in a vacuum or nitrogen, argon atmosphere. When pre-heating the graphite particles, the lowest heating temperature should be higher than the boiling point of the metal carbonyl complex for plating. The highest temperature should be determined by the plating thickness. The thicker of plating layer, the higher temperature is needed. On contrary, the thinner of plating layer, the lower temperature is needed. The concrete temperature is confirmed by calculating the quantity of heat needed for decomposing a unit mol volume of metal carbonyl complex.

b. After being heated to the needed temperature, graphite particles are transported to a plating room 7 with vibrator or blender 11. Open the entering switch of metal carbonyl steam 4. Input metal carbonyl steam to the plating room 7, turn on vibrator or blender 11 to begin plating.

c. Plated graphite particles are delivered to a cooling and passivating room 8. They are taken out after cooling and passivating or delivered to next heating-plating cycle until the requested thickness of film. At last, they are cooled, passivated, taken out, passivated, and packed.

In this invention, when pre-heating graphite particles, the heating temperature must be above the boiling point temperature $t_f$ of metal carbonyl compound for plating to $t_f+800°$ C., it is preferred in a temperature range from $t_f+50°$ C. to $t_f+600°$ C. The metal carbonyl complex as plating material is at least one selected from $Fe(CO)_5$, $CO_2(CO)_8$, $Ni(CO)_4$, $Mn_2(CO)_{10}$.

The plating layer of metal catalyst contains at least one selected from Fe, Co, Ni, Mn.

In the next pre-heating and plating cycle, the metal carbonyl complex can be the same as before to increase the thickness of film. It also can change the kind of metal carbonyl complex for plating another metal catalyst. Metal catalyst can be plated alternately or mixed.

An equipment of the preparation method comprises one or more heating chambers 6, one or more plating rooms 7, one or more vaporizing rooms of metal carbonyl compound 10 and one cooling and passivating room 8. The heating chamber 6 is connected with the plating room 7 which has a vibrator or blender 11 inside. The plating room 7 is connected with the vaporizing room 10 and cooling and passivating room 8.

Each room is set up with enter or outer meatus 3, 9 for protection gas and switch 2 for connection one another. Connection of heating chambers 6, plating rooms 7, vaporizing rooms 10, cooling and passivating rooms can be series-wound or shunt-wound. Thereby, a close, continuous, monolayer or multilayer and single element or multi-elements plating can be actualized.

The process is illustrated by plating iron on graphite with reference to the FIG. 1:

1. Graphite particles are added to heating chamber 6-1 via the entering filler. Then turn off the switch 2-0.

2. The entire system is vacuumized or replacement the atmosphere by $N_2$ or $Ar_2$.

3. Switch on the heat source of the heating chamber 6-1, heat up the graphite particles to 800° C.

4. Switch on the heat source of the vaporizing room 10-1, heat it up to above 104° C.

5. When the scheduled temperature of steps 3, 4 is reached, turn on the switching 2-1 between heating chamber 6-1 and plating room 7-1, deliver the heated graphite particles in the heating chamber 6-1 into the plating room 7-1. Then, turn off the switching 2-1 between the heating chamber 6-1 and plating room 7-1, put $Fe(CO)_5$ in vaporizing room 10-1. Turn on the switching 2-2 between vaporizing room 10-1 and plating room 7-1, transport $Fe(CO)_5$ stream into the plating room 7-1, and run vibrator or blender 11-1 for plating.

6. Turn off the switching 2-2 between vaporizing room 10-1 and plating room 7-1, turn on the switching 2-10 between the cooling and passivating room 8 and plating room 7-1, transport the plated graphite particles to the cooling and passivating room 8, and take them out after cooling and passivating. This step is for the plated graphite particles have completed plating.

7. Turn on the switching 2-5, add the plated graphite to heating chamber 6-2 to heat up again, and come into next plating cycle, until the plating thickness reaches prospective requirement. Then, transport them to cooling and passivating room 8 to passivate again.

8. Well plated, cooled and passivated graphite and metallic catalyst Composite is discharged from material discharging stomata 5. Sublimate and pack at last.

What is claimed is:

1. A method of coating graphite particles with a metallic catalyst layer for diamond synthesis comprising following steps:
   a. placing graphite particles use for diamond synthesis in a heating chamber for preheating the graphite particles in protection of vacuum or nitrogen or argon gas;
   b. feeding the heated graphite particles into a plating chamber with vibrator or agitator, then opening an inlet switch to feed steam of metal carbonyl complex into the planting chamber; after that, operating the vibrator or agitator, the metal carbonyl complex being decomposed to form a metal catalyst layer on the surface of the graphite particles evenly by the heat released from the pre-heated graphite particles;
   c. feeding the plated graphite particles coated with a metallic catalyst layer into a cooling and passivation chamber for cooling and passivation or feeding the graphite particles coated with a metallic catalyst layer into a next round of heating and coating until the coated graphite particles with a metallic catalyst layer having a required coating thickness; finally, cooling, passivating and packaging the graphite particles coated with a metallic catalyst layer.

2. The method according to claim 1, wherein the metal carbonyl complex is carbonyl Fe or carbonyl Co or carbonyl Ni or carbonyl Mn.

3. The method according to claim 1, wherein the preheating temperature for the graphite particles is over boiling temperature $t_1$ of the carbonyl metal complex used for coating to $t_1+800°$ C.

4. The method according to claim 3, wherein the graphite particles are preheated with a heating temperature between $t_1+50°$ to $t_1+600°$ C.

5. The method according to claim 1, wherein the metal carbonyl complex is at least one selected from $Fe(CO)_5$, $Co_2(CO)_8$, $Ni(CO)_4$ and $Mn_2(CO)_{10}$.

6. The method according to claim 1, wherein the metal catalyst layer includes at least one material selected from Fe, Co, Ni and Mn.

7. The method according to claim 1, wherein the next round of heating and coating in the Step c can use same metal carbonyl complex used for the prior round, or use different metal carbonyl complex from prior round for coating different metal catalyst layer, in this way coating of several different metal catalyst layers can be carried out.

* * * * *